United States Patent [19]

Eccleston

[11] Patent Number: 4,841,229
[45] Date of Patent: Jun. 20, 1989

[54] METHOD OF AND CIRCUIT FOR OHMMETER CALIBRATION

[75] Inventor: Larry E. Eccleston, Edmonds, Wash.

[73] Assignee: John Fluke Mfg. Co., Inc., Everett, Wash.

[21] Appl. No.: 127,704

[22] Filed: Dec. 2, 1987

[51] Int. Cl.[4] .......................................... G01R 27/02
[52] U.S. Cl. ...................................... 324/63; 324/62; 374/173; 73/1 R
[58] Field of Search ...................... 324/62, 63, 98, 130; 364/571, 482; 73/1 R; 374/172, 173

[56] References Cited

U.S. PATENT DOCUMENTS

| | | | |
|---|---|---|---|
| 3,805,616 | 4/1974 | Sugiyama | 374/173 |
| 4,041,382 | 8/1977 | Washburn | 324/63 X |
| 4,169,243 | 9/1979 | Payne et al. | 324/62 |
| 4,309,653 | 1/1982 | Stack et al. | 374/173 X |
| 4,323,972 | 4/1982 | Winter | 324/62 C |

Primary Examiner—Reinhard J. Eisenzopf
Assistant Examiner—Jack B. Harvey
Attorney, Agent, or Firm—Mikio Ishimaru; Stephen A. Becker

[57] ABSTRACT

The calibrator of an ohmmeter is compensated to eliminate any error as a result of the resistance of leads interconnecting terminals of the ohmmeter and a reference resistance to which the ohmmeter is connected during calibration. In accordance with one aspect of the invention, ohmmeter current flowing through a buffer amplifier biased by a floating power supply bypasses the ohmmeter leads. In accordance with another aspect, a current equal in magnitude but opposite in direction to the ohmmeter current is applied to the leads.

9 Claims, 4 Drawing Sheets

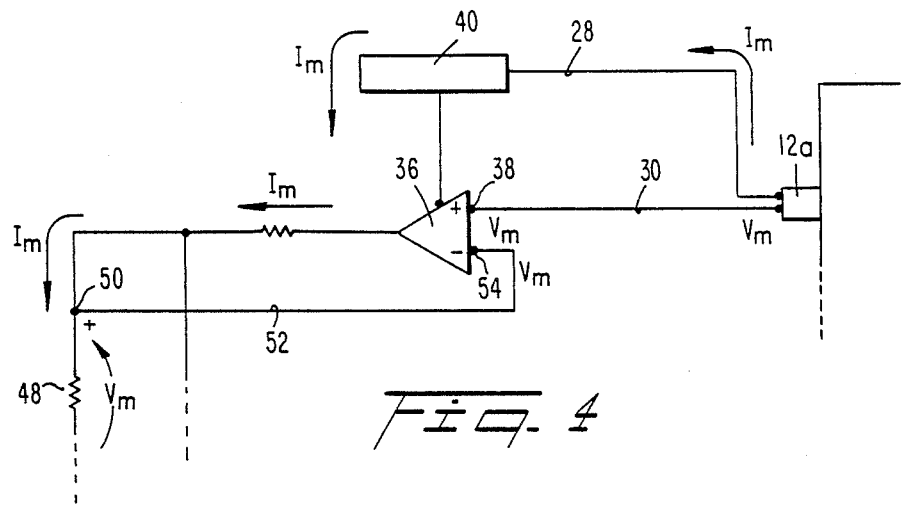
_Fig. 4_
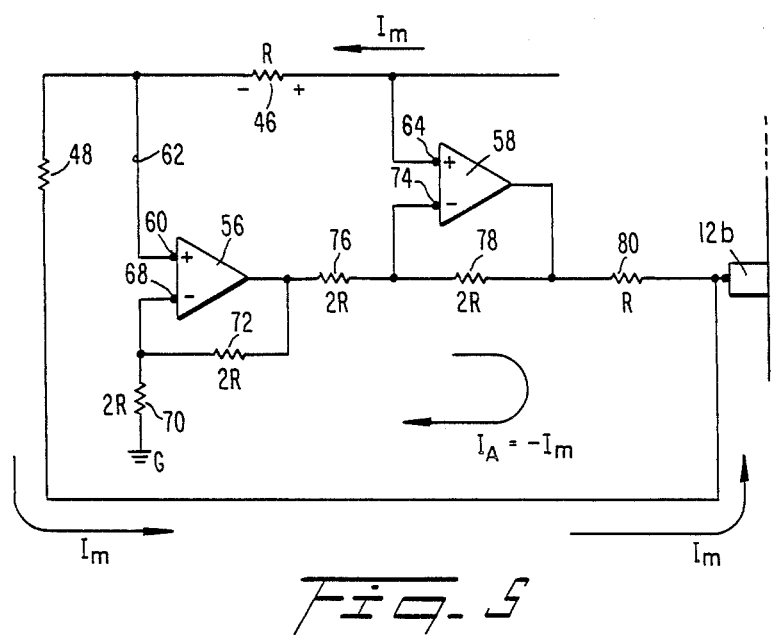
_Fig. 5_

METHOD OF AND CIRCUIT FOR OHMMETER CALIBRATION

TECHNICAL FIELD

This invention relates generally to instrumentation calibration, and more particularly, toward lead line resistance compensation of ohmmeter calibrators.

BACKGROUND ART

To measure the resistance of a load, an ohmmeter supplies a current having a known magnitude through a pair of output leads to the load. The voltage drop across the load as a result of ohmmeter current flowing therethrough is measured to drive an output which is calibrated to display resistance in ohms. However, because ohmmeter current flows both though the leads interconnecting the ohmmeter terminals and through the load, lead resistance, which is on the order of 0.05-0.1 ohm, contributes to error in the reading.

Precision laboratory ohmmeters avoid this source of error using a four lead output configuration that includes a pair of leads, termed "HI OUT" and "LO OUT" leads for supplying ohmmeter current to the load and another pair connected directly across the load to sense voltage. The second pair of leads, termed "Sense" leads, enable the voltage monitored by the ohmmeter terminals to ignore the voltage drop associated with ohmmeter leads themselves. Other types of ohmmeters, however, have two lead output configurations that include no lead resistance error elimination circuitry.

Laboratory ohmmeters and other instrumentation are calibrated following manufacture and from time to time thereafter by connecting the output leads of the ohmmeter to a standard or reference resistor having a very precisely known value of resistance, and adjusting the reading of the ohmmeter display to match the resistance value of the reference. Four lead ohmmeters are calibrated easily because the sense leads of the ohmmeter compensate for lead resistance between the ohmmeter terminals and the reference resistor. Calibration of two-lead ohmmeters, however, is more troublesome, because no convenient means to compensate or eliminate the effect of lead resistance on calibration of two-lead ohmmeters is known.

Accordingly, one object of the invention is to provide lead resistance compensation in instrumentation calibration equipment.

Another object of the invention is to provide new and improved ohmeter compensation, wherein the effect of lead resistance on ohms calibration is eliminated.

Another object is to provide a method of and circuitry for calibrating two-lead ohmmeters, wherein effect of lead resistance on ohms calibration is eliminated.

A further object of the invention is to provide new and improved electronic circuitry for lead resistance compensation of a two-lead ohms calibrator.

DISCLOSURE OF INVENTION

The above and other objects are satisfied, in accordance with the invention, by method of and circuitry for reducing or cancelling ohmmeter current in the leads interconnecting the terminals of an ohmmeter and the ends of a reference or calibration resistor within a two-lead ohms calibrator. The invention more specifically is applied within the environment of an ohmmeter having output terminals and first and second leads extending from the terminals to be connected to a load. A current generator within the ohmmeter causes an ohmmeter current having a predetermined magnitude to flow in the leads and a voltage difference between the leads as a result of current flowing therethrough is measured to obtain a reading of the electrical resistance of the load. A calibration circuit for calibrating the ohmmeter, in accordance with one aspect of the invention, comprises input terminals to be connected to the first and second leads, a reference resistance having a known value of resistance and means for applying the ohmmeter current to the reference resistance to provide to the ohmmeter a calibration reading corresponding to the resistance of the reference resistance. Any voltage drop within the ohmmeter leads as a result of resistance distributed therein which would impart an error to the calibration reading is compensated to eliminate the calibration reading error.

In accordance with one embodiment of the invention, calibration error compensation is provided by circuitry for conducting ohmmeter current between the ohmmeter terminals and the reference resistance, electrically bypassing the ohmmeter leads. Preferably, the circuitry includes a feedback amplifier biased by a floating supply and having its inputs connected respectively to the ohmmeter and to the calibration resistance for supplying ohmmeter current to the calibration resistance.

In accordance with a second embodiment, compensation is provided by circuitry for supplying to the ohmmeter leads a compensation current that is equal in magnitude and opposite in direction to the ohmmeter current. This circuitry preferably comprises means for establishing a current loop including one of the ohmmeter leads conducting the ohmmeter current, means for measuring the ohmmeter current and means responsive to the measuring means for generating the compensation current.

In accordance with a more specific aspect of the second embodiment of the invention, a sensing resistor in series with the calibration resistor monitors ohmmeter current and an amplifier is controlled in response thereto to generate the compensation current. The amplifier, in accordance with another aspect of the invention, comprises first and second operational amplifiers having noninverting inputs thereof connected respectively to opposite ends of the calibration resistor, with the second operational amplifier having an inverting input coupled to an output of said first operational amplifier. The first operational amplifier has an inverting input coupled to ground. The first and second amplifiers apply to the ohmmeter leads a compensation current that is equal in magnitude but opposite in direction to the ohmmeter current measured by the sensing resistor.

Still other objects and advantages of the present invention will become readily apparent to those skilled in this art from the following detailed description, wherein only the preferred embodiment of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 4 is a schematic diagram showing in more detail calibration error compensation in accordance with the first embodiment of the invention.

FIG. 5 is a schematic diagram showing in more detail calibration error compensation in accordance with the second embodiment.

BEST MODE FOR PRACTICING THE INVENTION

Figure 1:
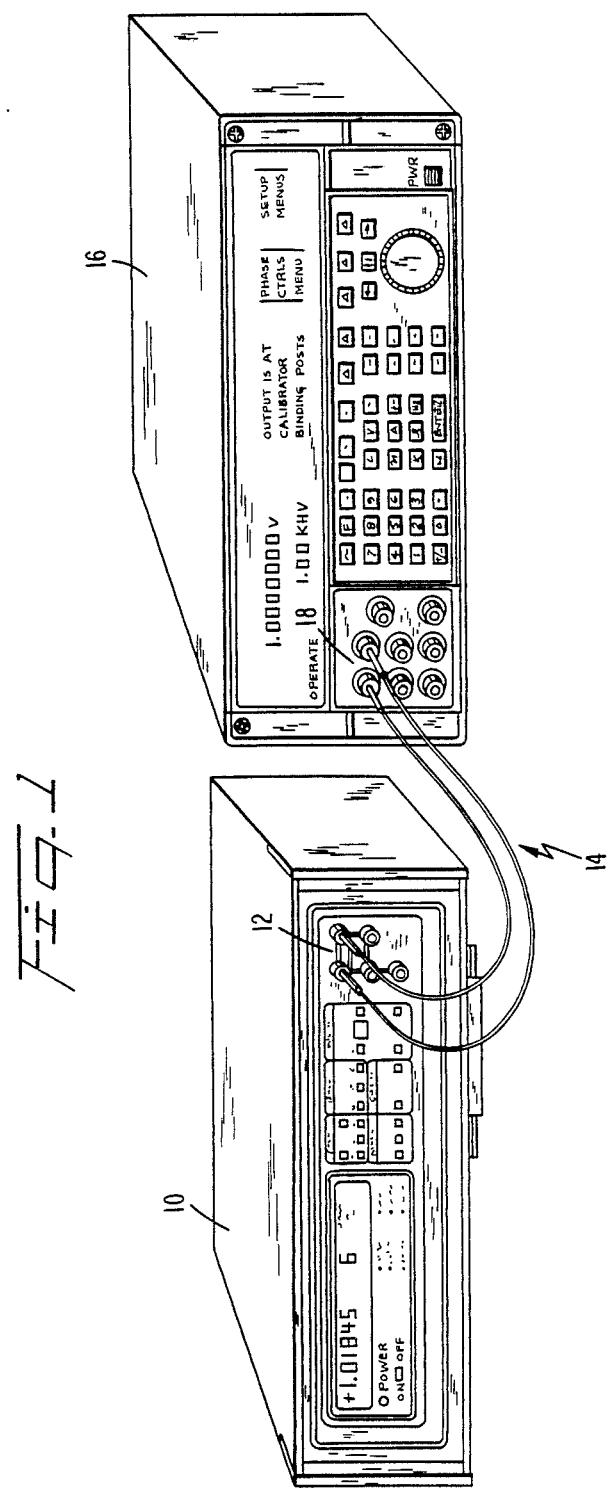
FIG. 1 is a perspective view of an ohmmeter and two-lead ohms calibrator in accordance with the invention, interconnected for calibration.

With reference to FIG. 1, a digital multimeter 10 has a pair of terminal posts 12 connected through leads 14 to a calibrator 16 that provides, at terminal posts 18, a precision resistance having a known value to be presented to the multimeter 10 for ohms calibration. The multimeter 10 is of any known type of laboratory multimeter, such as a model 8500A bus-structured, microprocessor-controlled digital multimeter, manufactured by John Fluke Mfg. Co., Everett, Wash. The calibrator 16, in accordance with the invention, contains novel lead line compensation circuitry that eliminates calibration error applied to the multimeter 10 as a result of resistance inherent in leads 14 that interconnect the terminal posts 12 and 18 of the two instruments.

Figure 2:
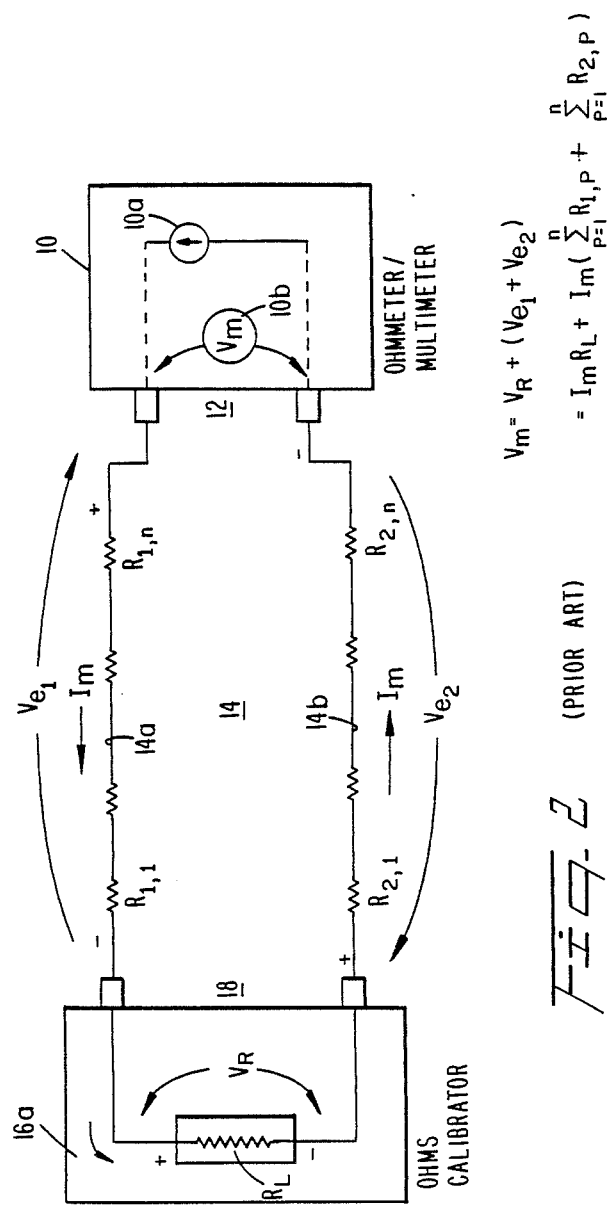
FIG. 2 is a diagram showing lead resistance distributed through the leads of an ohmmeter interconnected with a two-lead ohms calibrator of the prior art.

The effect of lead resistance on calibration error can be better appreciated with reference to FIG. 2, wherein multimeter 10 is connected to a conventional ohms calibrator 16a by leads 14 interconnecting the two instruments at terminal posts 12 and 18, respectively. In accordance with conventional two-lead ohms calibration of the multimeter 10, a precision calibration resistor $R_L$, connected to terminal posts 18 of the calibrator 16a, is presented to the multimeter 10 as a reference resistance to which the multimeter is to be calibrated. When the multimeter 10 is placed in its "ohmmeter mode" of operation, current from an internal constant current source 10a is supplied to the reference $R_L$ through leads 14, and resultant voltage at terminal posts 12 is measured by an internal voltmeter 10b. Theoretically, the value of voltage at the terminal posts 12 is equal to that a terminal posts 18 which in turn corresponds to the value of the reference resistance $R_L$, to which the multimeter reading is now calibrated.

However, in practice, there is a small difference between the voltage at terminal posts 18, corresponding to the voltage across reference resistor $R_L$, and the voltage at terminal posts 12. This voltage difference representing a calibration error, is created as a result of ohmmeter current $I_m$ flowing through resistance inherent in the leads 14 and symbolized as $R_{1,1} \ldots R_{1,n}$ and $R_{2,1} \ldots R_{2,n}$, in leads 14a and 14b, shown in FIG. 2. The error, although small, represents a significant error in the calibration of precision laboratory instrumentation. In accordance with the invention, this calibration error is eliminated in one embodiment by bypassing the leads 14 so that no ohmmeter current $I_m$ flows therethrough, and in another embodiment by supplying a compensation current $I_c$ in the leads 14 that is equal in magnitude but opposite in direction to the ohmmeter current $I_m$.

Figure 3:
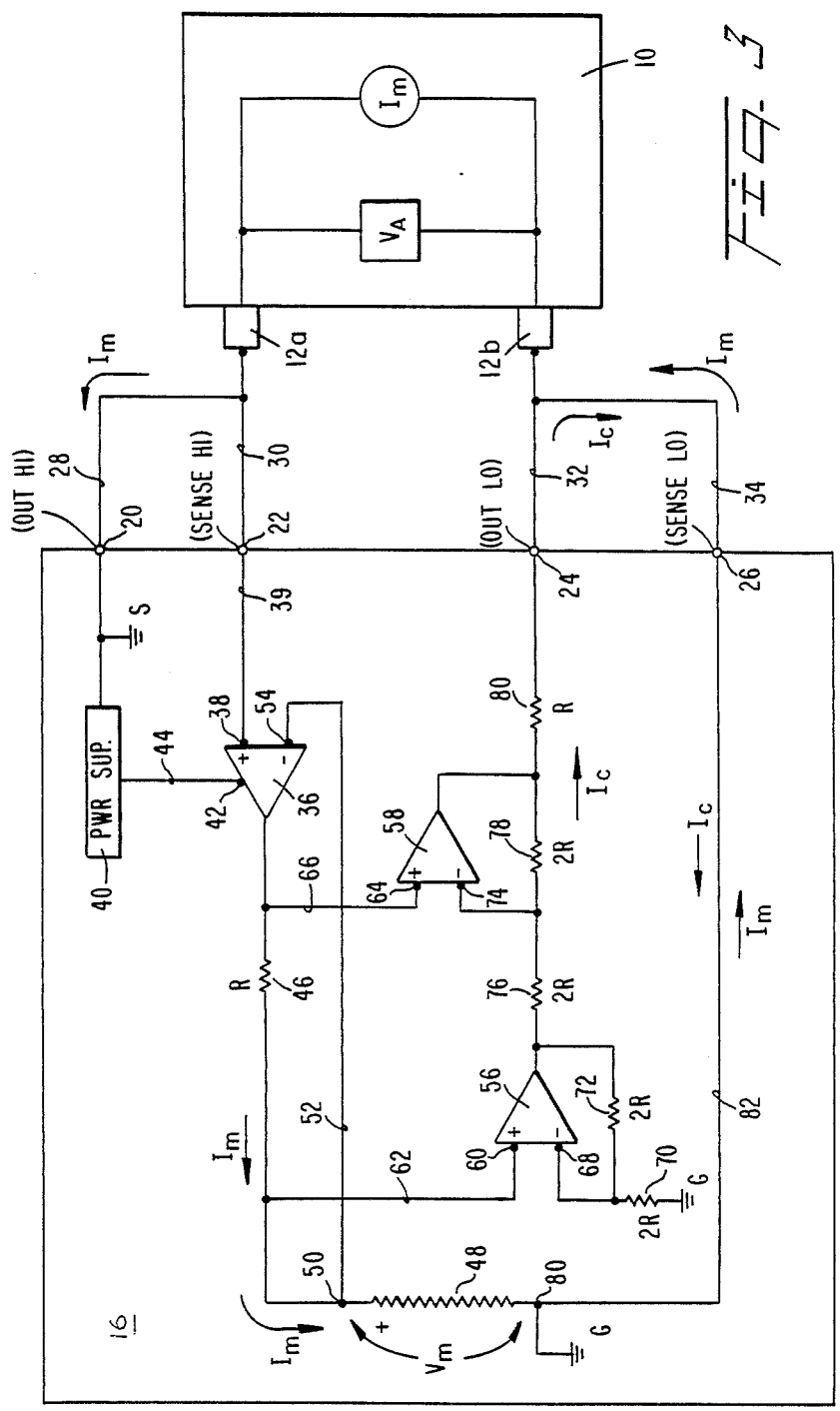
FIG. 3 is a schematic diagram showing two embodiments of circuitry for carrying out calibration error compensation, in accordance with the invention.

Referring now to FIG. 3, calibrator 16 has four terminal posts 20, 22, 24 and 26, with terminal posts 20 and 22 connected through leads 28, 30 to multimeter terminal post 12a and terminal posts 24 and 26 of the calibrator connected through leads 32, 14b to multimeter terminal post 12b. As is apparent, although four leads 28, 30, 32, 34 in FIG. 3 interconnect the calibrator 16 and multimeter 10, calibration of the multimeter is carried out at only two terminal posts 12a, 12b of the multimeter; in other words, the invention is used in a two-lead ohms calibration environment and not a four-lead ohms calibration environment involving both multimeter output and multimeter sense terminal posts.

In accordance with a first aspect of the invention, within the calibrator 16, an operational amplifier 36, selected to have a very low voltage offset, low temperature coefficient and high gain, has a non-inverting input 38 connected through line 39 to calibrator terminal post 22 ("Sense HI"). The inverting input 54 of the amplifier 36 is connected through line 52 to one end 50 of a calibration or reference resistor 48. The amplifier 36 is energized by a floating power supply 40 that is referenced through terminal post 20 ("Out HI") and leads 28 to multimeter terminal post 12a forming a floating ground (symbolized by "S"). The output of the power supply 40 is connected through line 44 to power supply input terminal 42 of amplifier 36.

The output of amplifier 36 in turn is connected, through a sense resistor 46, to calibration resistor 48. At end 50 of calibration resistor 48, sense line 52 is connected to the inverting input terminal 54 of amplifier 36, as aforementioned; the opposite end 80 of the resistor 48 is connected to a system ground G as well as via line 82 to terminal post 26 ("Sense LO"). Terminal post 26 in turn is connected to terminal post 12b through lead 34. Calibration terminal post 24 ("Out LO") which shall be described hereinafter is connected through line 32 to terminal post 12b of the multimeter 10.

The circuitry described so far eliminates calibration error as a result of voltage drop in lead 30 interconnecting the calibrator 16 and multimeter 10 by electrically bypassing that lead so that ohmmeter current does not flow therein and there is no voltage drop associated therewith. Thus, with reference to FIG. 4, ohmmeter current $I_m$ flows only through lead 28 to amplifier 36 through floating power supply 40, bypassing "Sense HI" lead 30. Voltage $V_m$ across calibration resistor 48 as a result of ohmmeter current $I_m$ flowing therethrough is applied to the non-inverting input 54 of the amplifier 36 via line 52. The high loop gain of amplifier 36 causes the voltage at non-inverting input terminal 54 to track voltage at terminal 50 of the resistor 48, Thus, the voltage at multimeter terminal 12a is maintained, by line 30, at the voltage $V_m$.

Because the ohmmeter current $I_m$ bypasses the lead 30 by conduction through lead 28 and the floating power supply 40, there is no voltage drop in lead 30, and accordingly there is no voltage error measured by volt meter 10b of the multimeter 10 associated with resistance in the lead. Ohmmeter current $I_m$, which passes through "OUT HI" terminal post 20 to floating power supply 40 and amplifier 36, passes through the sense resistor 46 and calibration resistor 48 and then back to the multimeter, through "SENSE LO" terminal 26 and lead 34, shown in FIG. 5. Accordingly, any calibration error as a result of voltage drop in line 30 interconnecting the calibrator and multimeter at terminal posts 12a and 22 is eliminated.

Referring again to FIG. 3, in accordance with a second aspect of the invention, the ohmmeter current $I_m$ is measured as a function of the voltage drop across sense resistor 46 by operational amplifiers 56 and 58. Amplifier 56 has a non-inverting input 60 connected to one end of resistor 46 through line 62; non-inverting input 64 of amplifier 58 is connected to the other end of resistor 46 through line 66. The non-inverting input 68 of amplifier 56 is connected, through resistor 70, to the system ground G; the output of the amplifier is connected to its non-inverting input through feedback resistor 72.

The amplifier 58 has a non-inverting input 64 connected to the output of amplifier 36 and an inverting input 74 that is connected, through a resistor 76, to the output of amplifier 56. A feedback resistor 78 interconnects the output of amplifier 5 to its inverting input 74, and a resistor 80 interconnects the output of the amplifier 58 to "Out LO" terminal post 24 of the calibrator 16. Resistors 46 and 80 have a common value R of resistance; resistors 70, 72, 76 and 78 have a common resistance value 2R.

Referring now to FIG. 5, it will be shown that the circuitry described applies, to lead 32 interconnecting the calibrator 16 and multimeter 10, a compensation current $I_c$ that is equal in magnitude and opposite in direction to the ohmmeter current $I_m$, whereby there is no voltage drop and associated calibration error in the lead 32.

Amplifiers 56 and 58 double the voltage drop across sense resistor 46 as a result of ohmmeter current $I_m$ flowing therethrough, and applies that doubled voltage to resistor 80 to develop compensation current $I_c$ that is equal in magnitude but opposite in direction to the ohmmeter current $I_m$ in resistor 46. More particularly, amplifiers 56 and 58 are configured to have differential gains of two, as described in Graeme and Tobey, *Operational Amplifiers Design and Amplification*, McGraw Hill Book Company (1971) at pages 430–432. With close matching of resistors 70, 72, 76 and 78, the output of amplifier 58 accordingly is equal in magnitude but opposite in direction to the voltage across sense resistor 46, so that compensation current $I_c$ that is caused to flow through resistor 80 and leads 32, 34 and 82, cancels the ohmmeter current $I_m$ therein. Accordingly, there is no voltage drop in the lead 32 interconnecting calibrator 16 and multimeter 10 at terminal posts 24 and 12b.

Because one aspect of the invention eliminates any voltage drop in lead 30 interconnecting the calibrator 16 and one terminal post 12a of multimeter 10 by current bypassing that lead, and since ohmmeter current in lead 32 interconnecting the calibrator and the other terminal post 12b of the multimeter is cancelled, the voltage across calibration resistor 48 is equal to the voltage across multimeter terminal posts 12a and 12b, measured by voltmeter 10b of the multimeter 10, so that there is no calibration error.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein. For example, although two different compensation circuits shown in FIGS. 4 and 5 are combined to provide compensation respectively of ohmmeter leads 30 and 32, for resistance thereon, it is understood that either circuit could be applied to compensate both leads.

What is claimed is:

1. For an ohmmeter having an output consisting of first and second terminals, and first and second leads extending from said terminals to be connected to a load, current generator means for causing an ohmmeter current having a predetermined magnitude to flow in said leads and means for measuring a voltage difference between said leads as a result of said current flowing therethrough to obtain a reading of the electrical resistance of said load:

a calibration circuit for calibrating said ohmmeter, comprising
      input terminals to be connected to said first and second leads;
      reference resistance means having a known value of resistance;
      means for applying said ohmmeter current to said reference resistance means to provide to said ohmmeter a calibration reading corresponding to the resistance of said reference resistance means, wherein a voltage drop within said ohmmeter leads as a result of resistance distributed therein imparts an error to said calibration reading; and
      means for compensating said calibration circuit for said voltage drop to eliminate said calibration reading error, comprising circuit means for conducting said current between said ohmmeter terminals and said reference resistance means, and not through said ohmmeter leads, electrically bypassing said ohmmeter leads.

2. The calibration circuit of claim 1, wherein said compensating means further comprises feedback amplifier means having inputs connected to said ohmmeter and to said reference resistance means for supplying said ohmmeter current to said reference resistance means.

3. The calibration circuit of claim 2, wherein said amplifier means includes a power supply input terminal for receiving operating current, and said calibration circuit includes floating power supply means connected to one of said terminals of said ohmmeter for supplying said ohmmeter current to said power supply input terminal.

4. For an ohmmeter having an output consisting of first and second terminals, and first and second leads extending from said terminals to be connected to a load, current generator means for causing an ohmmeter current having a predetermined magnitude to flow in said leads and means for measuring a voltage difference between said leads as a result of said current flowing therethrough to obtain a reading of the electrical resistance of said load;

a calibration circuit for calibrating said ohmmeter, comprising
      input terminals to be connected to said first and second leads;
      reference resistance means having a known value of resistance;
      means for applying said ohmmeter current to said reference resistance means to provide to said ohmmeter a calibration reading corresponding to the resistance of said reference resistance means, wherein a voltage drop within said ohmmeter leads as a result of resistance distributed therein imparts an error to said calibration reading; and means for compensating said calibration circuit for said voltage drop to eliminate said calibration reading error, comprising circuit means for supplying to said ohmmeter leads a compensation current that is equal in magnitude and opposite in direction to said ohmmeter current, said circuit means including means for establishing a loop current including one of said ohmmeter leads conducting said ohmmeter current, a sense resistor in series with said reference resistance means, and means including a voltage doubling amplifier circuit for monitoring a voltage drop across said sense resistor and, in response, generating said compensation current.

5. The calibration circuit of claim 4, wherein said amplifier circuit comprises operational amplifier means having first and second input terminals connected respectively to opposite ends of said sense resistor.

6. The calibration circuit of claim 5, wherein said operational amplifier means comprises first and second operational amplifiers having non-inverting inputs thereof connected respectively to said opposite ends of said sense resistor, said second operational amplifier having an inverting input coupled to an output of said first operational amplifier, said first operational amplifier having an inverting input coupled to a ground.

7. For an ohmmeter calibrator, wherein said ohmmeter has and output consisting of first and second terminals, and first and second leads extending from said terminals to be connected to a load, current generator means for causing an ohmmeter current having a predetermined magnitude to flow in said leads and means for measuring a voltage difference between said leads as a result of said current flowing therethrough to obtain a reading of the electrical resistance of said load, and wherein said calibrator comprises input terminals to be connected to said first and second leads, reference resistance means having a known value of resistance, means for applying said ohmmeter current to said reference resistance means to provide to said ohmmeter a calibration reading corresponding to the resistance of said reference resistance means, wherein a voltage drop within said ohmmeter leads as a result of resistance distributed therein imparts an error to said calibration reading:

a method of compensating said calibration circuit for said voltage drop to eliminate said calibration reading error, comprising conducting said ohmmeter current between said ohmmeter terminals and said reference resistance means, and not through said ohmmeter leads, electrically bypassing said ohmmeter leads.

8. For an ohmmeter having an output consisting of first and second terminals, and first and second leads extending from said terminals to be connected to a load, current generator means for causing an ohmmeter current having a predetermined magnitude to flow in said leads and means for measuring a voltage difference between said leads as a result of said current flowing therethrough to obtain a reading of the electrical resistance of said load:

a calibration circuit for calibrating said ohmmeter,
input terminals to be connected to said first and second leads;
reference resistance means having a known value of resistance;
means for applying said ohmmeter current to said reference resistance means to provide to said ohmmeter a calibration reading corresponding to the resistance of said reference resistance means, wherein a voltage drop within said ohmmeter leads as a result of resistance distributed therein imparts an error to said calibration reading; and means for compensating said calibration circuit for said voltage drop to eliminate said calibration reading error, comprising circuit means for conducting said current between said ohmmeter terminals and said reference resistance means, electrically bypassing said ohmmeter leads;

wherein said compensating means further comprises feedback amplifier means having inputs connected to said ohmmeter and to said reference resistance means for supplying said ohmmeter current to said reference resistance means; and wherein said feedback amplifier means includes a power supply input terminal for receiving operating current, and said calibration circuit further includes floating power supply means connected to one of said terminals of said ohmmeter for supplying said ohmmeter current to said power supply input terminal.

9. For an ohmmeter having an output consisting of first and second terminals, and first and second leads extending from said terminals to be connected to a load, current generator means for causing an ohmmeter current having a predetermined magnitude to flow in said leads and means for measuring a voltage difference between said leads as a result of said current flowing therethrough to obtain a reading of the electrical resistance of said load:

a calibration circuit for calibrating said ohmmeter, comprising
input terminals to be connected to said first and second leads;
reference resistance means having a known value of resistance;
means for applying said ohmmeter current to said reference resistance means to provide to said ohmmeter a calibration reading corresponding to the resistance of said reference resistance means, wherein a voltage drop within said ohmmeter leads as a result of resistance distributed therein imparts an error to said calibration reading; and means for compensating said calibration circuit for said voltage drop to eliminate said calibration reading error, comprising circuit means for supplying to said ohmmeter leads a compensation current that is equal in magnitude and opposite in direction to said ohmmeter current, said compensating means including means for establishing a loop current including one of said ohmmeter leads conducting said ohmmeter current, a sense resistor in series with said reference resistance means, and means for monitoring a voltage drop across said sense resistor, including operational amplifier means having input terminals connected to said sense resistor, for generating said compensation current; and wherein said operational amplifier means comprises first and second operational amplifiers having non-inverting inputs thereof connected respectively to said opposite ends of said sense resistor, said second operational amplifier having an inverting input coupled to an output of said first operational amplifier, said first operational amplifier having an inverting input coupled to a ground.

* * * * *

UNITED STATES PATENT AND TRADEMARK OFFICE
CERTIFICATE OF CORRECTION

PATENT NO. : 4,841,229

DATED : June 20, 1989

INVENTOR(S) : Larry E. ECCLESTON

It is certified that error appears in the above-identified patent and that said Letters Patent is hereby corrected as shown below:

In Column 5:

line 26, change "32" to --34--;

line 31, change "32" to --34--;

line 49, change "24" to --26--;

line 54, change "32" to --34--.

Signed and Sealed this

Second Day of November, 1993

Attest:

BRUCE LEHMAN

*Attesting Officer*      *Commissioner of Patents and Trademarks*